United States Patent [19]

Yamazaki et al.

[11] Patent Number: 4,937,651
[45] Date of Patent: Jun. 26, 1990

[54] SEMICONDUCTOR DEVICE FREE FROM THE CURRENT LEAKAGE THROUGH A SEMICONDUCTOR LAYER AND METHOD FOR MANUFACTURING SAME

[75] Inventors: Shunpei Yamazaki, Tokyo; Kunio Suzuki; Mikio Kinka, both of Atsugi; Takeshi Fukada, Ebina; Masayoshi Abe, Tama; Ippei Kobayashi, Atsugi; Katsuhiko Shibata, Atsugi; Masato Susukida, Atsugi; Susumu Nagayama, Tokyo; Kaoru Koyanagi, Saku, all of Japan

[73] Assignee: Semiconductor Energy Laboratory Co., Ltd., Kanagawa, Japan

[21] Appl. No.: 899,160

[22] Filed: Aug. 22, 1986

[30] Foreign Application Priority Data

Aug. 24, 1985 [JP] Japan .................. 60-186205
Aug. 24, 1985 [JP] Japan .................. 60-186206
Nov. 6, 1985 [JP] Japan .................. 60-248640

[51] Int. Cl.$^5$ ............... H01L 45/00; H01L 29/34
[52] U.S. Cl. ............................. 357/52; 357/2; 357/54
[58] Field of Search ............. 357/30 J, 30 E, 17, 357/2, 52, 54

[56] References Cited

U.S. PATENT DOCUMENTS

| | | |
|---|---|---|
| 4,166,918 | 9/1979 | Nostrand et al. . |
| 4,292,092 | 9/1981 | Hanak .................. 357/91 |
| 4,406,913 | 9/1983 | Weyrich .............. 357/30 J |
| 4,544,797 | 10/1985 | Hewig . |
| 4,607,273 | 8/1986 | Sakurada et al. ....... 357/36 |
| 4,633,034 | 12/1986 | Nath et al. ............ 357/30 J |
| 4,640,002 | 2/1987 | Phillips et al. ........ 356/237 |
| 4,698,494 | 10/1987 | Kato et al. ............ 250/578 |
| 4,700,463 | 10/1987 | Hama . |
| 4,730,207 | 3/1988 | Yamazaki ................ 357/4 |

FOREIGN PATENT DOCUMENTS

| | | |
|---|---|---|
| 60746 | 1/1965 | Australia . |
| 81566 | 11/1982 | Australia . |
| 0060487 | 9/1982 | European Pat. Off. . |
| 0073713 | 3/1983 | European Pat. Off. . |
| 0134364 | 3/1985 | European Pat. Off. . |
| 77263 | 5/1983 | Japan .................. 136/290 |

OTHER PUBLICATIONS

Patent Abstracts of Japan, vol. 8, No. 123 (E-249) [1560], 8th, Jun. 1984; & JP-A-59 35490 (Sanyo Denki K. K.) 2/27/84.

*Primary Examiner*—J. Carroll
*Attorney, Agent, or Firm*—Sixbey, Friedman, Leedom & Ferguson

[57] ABSTRACT

An improved semiconductor device is disclosed which is free from current leakage due to pin-holes or other gaps. Also an improved method for processing a semiconductor device is shown. According to the invention, gaps produced in fabricating process of the semiconductor layer are filled with insulator in advance of deposition of electrodes.

11 Claims, 7 Drawing Sheets

SEMICONDUCTOR DEVICE FREE FROM THE CURRENT LEAKAGE THROUGH A SEMICONDUCTOR LAYER AND METHOD FOR MANUFACTURING SAME

BACKGROUND OF THE INVENTION

This invention relates to a semiconductor device and a method for manufacturing same in which the performance of the semiconductor device is improved. More particularly, this invention relates to measures for eliminating disadvantages caused by the effect of electrical shorts and shunts due to pin-holes or other gaps created during the fabrication process of the device.

Recently, considerable efforts have been made to develop systems for depositing amorphous semiconductor alloys, each of which can encompass relatively large areas, and which can be doped to form p-type and n-type materials for the production of p-i-n and other type devices which are, in photovoltaic and other applications, substantially equivalent to their crystalline counterparts. As such device, the applicant disclosed improved photoelectric cells in Japanease Patent Published Application Nos. sho 55-4994, 55-124274, 56-13777, 56-13778 and 56-13779.

One example of prior art photovoltaic device is shown in FIG. 1. In the figure, a transparent conductive film 2 is formed on a glass substrate 1 with a mask aligned above the substrate 1. Semiconductor layers 3 are deposited on the substrate 1 with the conductive film 2 therebetween with a mask aligned above the substrate 1. Further, on the substrate 1 with the conductive film 2 and the semiconductor layers 3, aluminium layer 4 are formed as second electrodes with a mask. Reference numerals 31 and 11 designate photoelectric cells respectively in the figure.

The two cells 31 and 11 are connected in series by means of a connection 12. In the connection 12 the second electrode 38 is made in contact with the first electrode 37. Upper electrode 39 is connected to external connection 5. Although the figure appears only with two connections, a number of the cells are connected with each other in series. The integrated photovoltaic device tends to be degraded after thermal treatment at 150° C. for tens of hours. Such device is not suitable for outdoor use where the device is likely subjected to high temperature ambience. Further more it is impossible to perform the patterning of the aluminum layer 14 with laser processsing, instead of that with masks, since the laser beam is likely to injure the thin semiconductor film during processing. Efficiency of the patterning with masks can not be expected so much due to low accuracy in aligning the masks with the pattern, there being enjoyed no self alignment.

Further the voltage and current output of the thin film solar cells may be greatly reduced or completely eliminated by electrical short or shunts formed during the fabrication of the solar cell. Electrical shorts occur when there is a pinhole in the semiconductor layer and the front and back electrodes are touching. A shunt is the loss of charge in the semiconductor body due to imperfect barrier formation or the formation of an ohmic contact by high work function metal rather than a Schottky barrier formation. The problem of solar cell defects which cause shorts or shunts increase greatly with increasing solar cell size. If large area of solar cells are to be economically feasible, the methods of eliminating these shorts and shunts during fabrication or removing the defects after processing must be developed.

SUMMARY OF THE INVENTION

It is therefore an object of the invention to provide an improved semiconductor device and a method for fabricating same in which adverse short circuits are effectively eliminated.

It is another object of the invention to provide an improved semiconductor device and a method for fabricating same in which undesirable shunts are eliminated with only simple procedure.

DETAILED DESCRIPTION OF THE PREFERRED EMBODIMENTS

Figure 1:
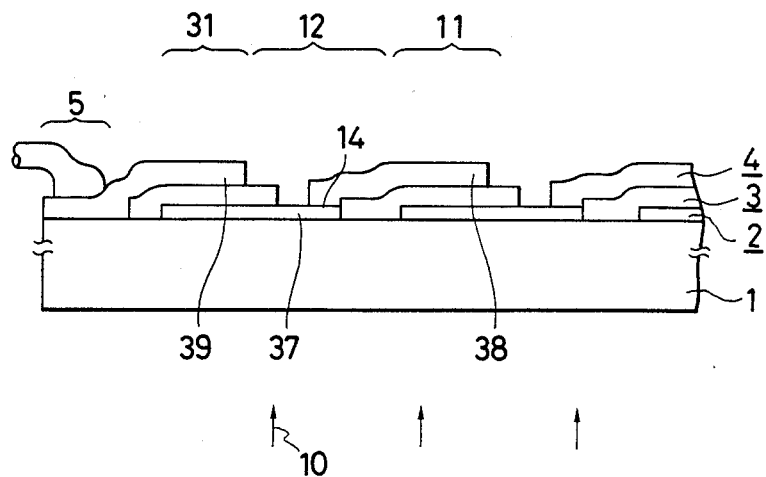
FIG. 1 is a fragmentary, cross sectional view of a prior art solar cell.

Referring to FIGS. 2(A) through 2(D), an embodiment of the invention is shown.

In the figure, a transparent electrode is formed and patterned on transparent substrate 1 made of, for example, glass pane of 1.2 mm thick×10 cm long×10 cm wide. The transparent electrode 3 is made, inter alia, from an ITO layer 1500 angstroms thick superimposed by a $SnO_2$ layer 200 to 400 angstroms thick, an ITO layer 1500 angstroms thick superimposed with a $Sn_3N_4$ layer 500 angstroms thick, or a transparent layer doped with halogen of 1500 through 2000 thickness mainly made of tin oxide or tin nitride by a CVD method in vacuum, a LPCVD method, a spraying method or a sputterring method.

The layers thus laminated is irradiated from upper or lower side of the substrate 1 with laser beam of 1.06 micron meters wave length or 0.53 micron meter wave length from a YAG laser to perform the patterning for the transparent electrode 2. The grooves 13 of 10 cm long formed by the patterning partition adjacent ones of cells, each groove having 10 to 20 mm width. On the layer is formed, by a plasma or photo CVD method a non single crystal layer 3 having p-n or p-i-n junction of 0.2 to 1.0 micron meter thickness, normally of 0.5 to 0.7 micron meter thickness. For instance, the nonsinglecrystal layer can be comprised, with a p-i-n junction, of a p-type semiconductor layer ($Si_xC_{1-x}$; $1>x>0$) 50 to 150 angstroms thick, an intrinsic amorphous or intrinsic semiamorphous silicon semiconductor layer 0.4 to 0.9 angstrom thick, and a crystallite layer 200 to 500 micron meter thick.

On the semiconductor layer 3, a lot of gaps and pinholes 6 and 6' result unintentionally due to falling out of flakes which are involved into the semiconductor layer 3 during fabrication. There are observed about two to four such defects in ten fields of views through a microscope with a magnification of 100 to 1000.

According to the invention, the holes 6 and 6' are filled and stopped with insulator. Hereinbelow, the stopping process will be explained in detail.

The semiconductor layer 3 with the holes 6 and 6' is coated with photocurable organic resin by a spinner or a coater in the manner that all the holes are filled completely with the resin 7 and 7'. The organic resin may be "photoneeth" distributed from Toray industries Inc. or other known photo resist. For instance, an amount of photoneeth having viscosity of about 120 CP is applied on the layer 3 to 0.2 through 5.0 micro meters thickness by spinning at 500 rpm for 10 seconds and thereafter at 2000 rpm for 30 seconds followed by a prebaking at 85° C. for an hour. The organic layer 3 is irradiated with ultraviolet light 17 having 300 to 400 nanometers wavelength from the glass substrate side. The ultraviolet light can not penetrate the semiconductor layer 3 because of the absorption in the layer whereas the resin stopping the holes 6 and 6' are cured selectively. In other words, the intensity and the wave length are chosen so that the semiconductor layer 3 can function as a mask. Then, the uncured resin is eliminated by a known rinsing. The remaining resin cured in the holes is chemically stabilized by sintering and post-curing. Thus the stopping process is completed.

Figure 2A:
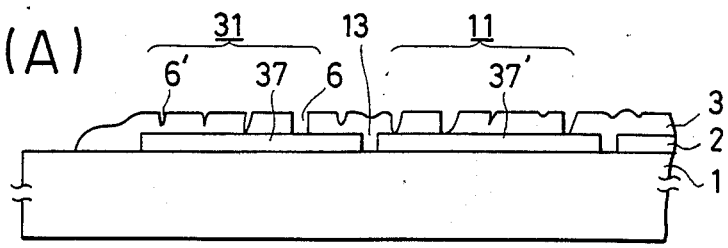
FIGS. 2(A) through 2(D) are fragmentary, cross sectional views showing manufacturing process of an embodiment of the invention.
Figure 2B:
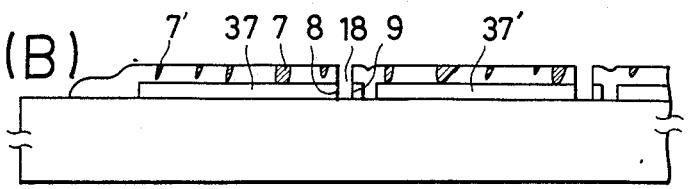
Figure 2C:
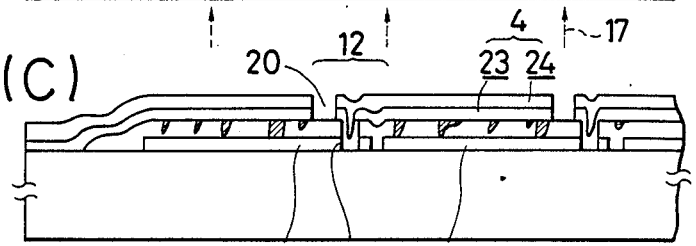
Figure 2D:
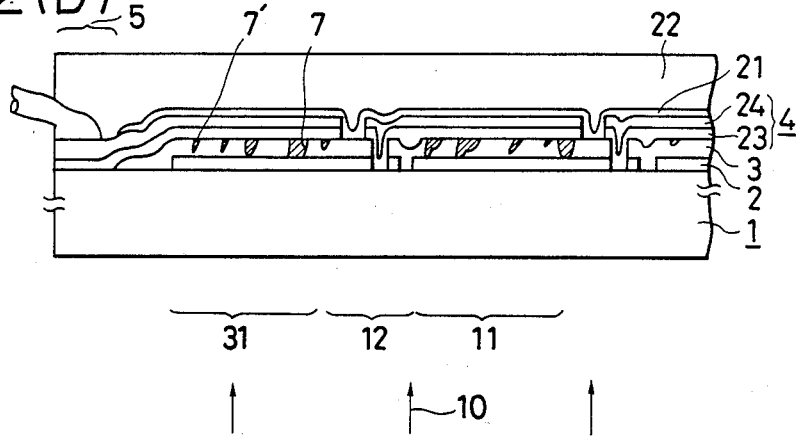

After stopping the holes, openings 18 are formed adjacent to the groove 13 as shown in FIG. 2(B) by means of laser scribing to provide an access to the first electrodes 37 and 37' via side contacts 8 and 9. Although the openings 18 reach the substrate 1 in the figure, they can be more shallow as long as the first electrodes 37 and 37' are exposed from the opening. A second electrode 4 consisting of two conductive layers 23 and 24 is deposited on the laminated layers and separated into portions by grooves 20 by laser scribing.

The lower conductive layer 23 may be 300 to 1400 angstroms thick and made from ITO, $In_2O_3$, $SnO_2$ or ITN (a mixture of indium nitride and tin nitride). The upper conductive layer 24 may be 300 to 500 angstroms thick and made, as a single or double layer, from aluminium, chrom or silver. For example the second electrode 4 may composed of an aluminium layer 1000 angstroms thick on a ITO layer 1500 angstroms thick. The aluminium layers 24 prepare inside surfaces on which incident light 10 enterring from the substrate side can reflected. The ITO layers 23 are disposed to prevent the aluminium layer from corroding due to interaction with the semiconductor layer. These two layers are fabricated by an electron beam deposition or a plasma CVD method at less than 300° C. As a result an improved solar cell is provided with which light having wave length of 600 to 800 nm can be efficiently converted into electricity.

For proximately contact with a n-type semiconductor, a transparent indium compound or mixture including indium oxide and/or indium nitride is considered adequate as the transparent layer 23. For a p-type semiconductor, a tin compound or mixture of $SnO_2$, $Sn_3N_4$ and/or $SbN$ is adequate in view of high efficiency and reliability for long time.

The transparent electrode 23 is made in contact with the first electrode 2 at the opening 18. At this contact there is only a hetero- or homo-junction of a nitride and/or an oxide so that no interaction occurs even at 150° C., unlike the prior art illustrated in FIG. 1 forming metal junction. In addition to this, such a laminated electrode 4 is advantageous especially for laser patterning. Namely the aluminium electrode 24 can be removed in the patterning togather at once with the laser scribing of transparent electrode 23 which is easily sublimated under irradiation of laser beam and carries the aluminium electrode thereon away from the substrate.

A passivation film of silicon nitride 21 is deposited to 500 to 2000 angstroms thickness by a photo CVD method or plasma vapor deposition; and a take-out line 5 is provided on the aluminium electrode 24. Thus, following placing a organic resin layer 22 such as of polyimide, polyamide, kapton or epoxy, the semiconductor device is made into a photoelectric conversion device in which a plurality of cells 31 and 32 are connected in series by the connection 12.

The organic resin is provided mainly for fixation of the take-out electrode 5. Further a device of 120 cm×40 cm, two device of 60 cm×40 cm, or six device of 40 cm×20 cm are integrally packaged into a 120 cm×40 cm panel according to NEDO standard.

Experimental results were obtained with a solar cell manufactured according to the above explained process having a substrate of 10 cm long×10 cm wide as below;
open-circuit voltage: 12.77 V
fill factor: 0.574
short-circuit current: 69.0 mA
conversion efficiency: 7.46%.

Also, experimental results are obtained with a solar cell which is manufactured without the stopping process, while other process being similar to the above, as below;

|  | sample 1, | sample 2 |
| --- | --- | --- |
| open-circuit voltage | 11.49 V | 3.02 V |
| fill factor | 0.471 | 0.316 |
| short-circuit current | 53.7 mA | 54.20 mA |
| conversion efficiency | 4.43% | 0.75 mA |

From the above data, it is understood that the stopping hole process makes solar cells more efficient.

Figure 3:
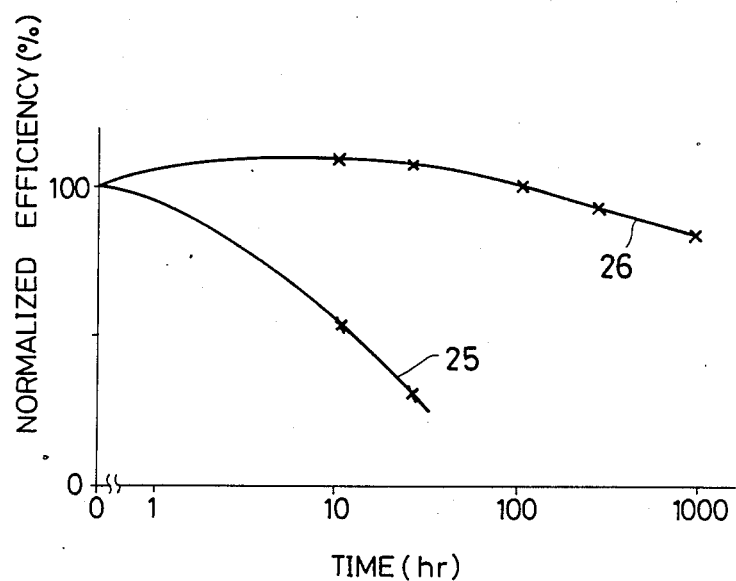
FIG. 3 is a graphical diagram showing the relation between time and efficiency.

FIG. 3 shows the trend of normalize efficiencies with time obtained by reliability trials of solar cells according a prior art and the invention under an atmospheric condition but at 150° C. A curve 25 shows the normalized efficiency of the prior art having the configuration of FIG. 1; the efficiency is degraded with time passing. In the prior art device, the aluminium electrode 4 is made in contact with the semiconductor layer 3 and in the contact 12 there is the tin oxide layer 37 in contact with the aluminium electrode 4. These contacts give rise to oxidation of the aluminium electrode 4 and to interaction between the electrode 4 and the semiconductor layer 3 of n-type. Because of this, the efficiency is degraded to less than 50% of the initial value only after ten hours or the like.

On the other hand, a curve 26 is plotted for the embodiment of the invention provided with resin stopping the holes and the laminated electrode 4. In this configuration only oxide-oxide contacts appear making the contact 12 stable and reliable. The other important feature of the invention is, not illustrated in the figure, that high yield can be obtained since the fluctuation of the characteristics among products is small. For instance, 0.27 was obtained as a variance of efficiency from ten samples of 10 cm long×10 cm wide.

Referring to FIGS. 4(A) to 4(D), another embodiment of the invention is illustrated. On a substrate 1 such as a glass pane of 1.2 mm thick×10 cm long×10 cm wide is formed a conductive transparent film 2, e.g., a laminated film of an ITO layer 1500 angstroms thick on a $SnO_2$ layer 200 to 400 angstroms thick or a transparent film mainly composed of tin oxide or tin nitride doped with halogen. The film may be fabricated by a LPCVD method, a plasma CVD method, a spraying method, sputtering method and an ECR method.

The conductive film 2 is divided into a plurality of sections by patterned grooves 12 which are formed by laser beam of 1.06 micron meters wave length or 0.53 micro meters wave length from a YAG laser under controlling by a micro computer.

The patterned grooves are 50 micro meter wide and 10 cm long by which each section is partitioned from others with 10 to 20 mm width. On this film a nonmonocrystal layer is formed with p-n junction or p-i-n junction at 0.2 to 1.0 micron meter thickness, more preferably 0.5 to 0.7 micron meter thickness. A preferred example is a laminated layer composed of a p-type semiconductor layer ($Si_xC_{1-x}$; $1>x>0$) of 50 to 150 angstroms thick, an intrinsic amorphous or intrinsic semiamorphous silicon semiconductor layer 0.4 to 0.9 micron meter thick, and a crystallite layer 200 to 500 angstroms meter thick.

The semiconductor layer 3 with the holes 6 and 6' is coated with photocurable organic resin in the manner that all the hole are filled completely with the resin by a spinner or a coater. The organic resin may be a photo resist of positive type such as OFPR-800 distributed by Tokyo Ohka Kogyo Co., Ltd. or other known photo resist. For instance, an amount of photoresist is applied on the layer 3 to a thickness of 0.1 through 0.5 micro meters by spinning at 500 rpm for 5 seconds and thereafter at 2000 rpm for an hour followed by a prebaking at 85° C. for 40 minutes. The organic layer 3 is irradiated with ultraviolet light 17 having 300 to 400 nanometers wavelength from the photoresist side. as the caring for OFPR-800 is carrying out irradiation of ultraviolet light of 6 mW/cm² for 5 seconds followed by after treatments. Then, the unfixed resin is eliminated by a known rinsing with pure water for 10 minutes. The remaining resin fixed in the holes 6 and 6' is chemically stabilized by sinter and post-cure. For instance, the layer is let undergo post baking for an hour at 150° C. Thus the stopping process is completed.

Figure 4A:
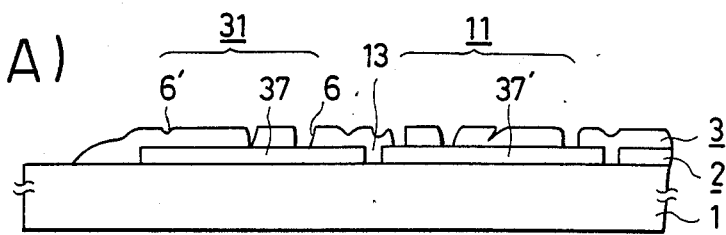
FIGS. 4(A) through 4(D) are fragmentary, cross sectional views showing another embodiment of the invention.
Figure 4B:
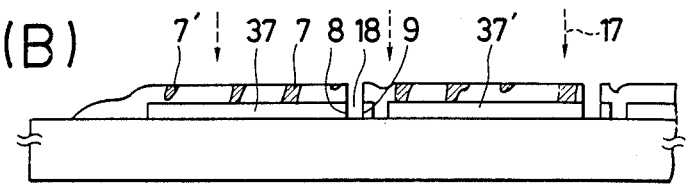
Figure 4C:
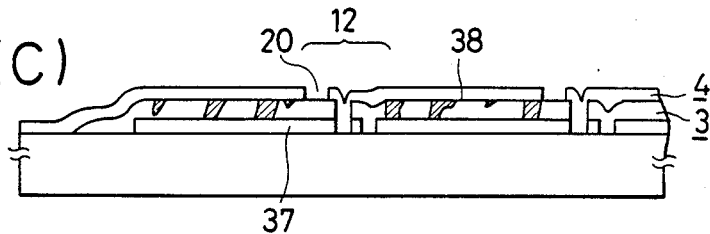

After stopping the holes, openings 18 are formed adjacent to the groove 13 as shown in FIG. 4(B) by means of laser scribing to provide an access to the first electrodes 37 and 37'. Although the openings 18 reach the substrate 1 in the figure, they can be more shallow as long as the first electrodes 37 and 37'. A second electrode 4 which may consist of two conductive layers is deposited on the laminated layers and separated into portions by grooves 20 scribed by laser scribing.

The second electrode may be a transparent conductive layer 300 to 500 angstroms thick, for example, made of ITO, $In_2O_3$, $SnO_2$ or ZnO through which incident light can go out of the device.

On the other hand, the second electrode may be formed reflective by deposition, on the transparent electrode, of aluminium, chromium or silver as a single-layered reflective film, or aluminium and nickel as a double-layered reflective film. In this embodiment, the second electrode is comprised of a ITO layer 1050 angstroms thick and a aluminium layer 1000 angstroms thick. The electrode can be formed by sputtering, an electron beam deposition or plasma CVD method at less than 300° C. in order not to render the semiconductor degraded.

Figure 4D:
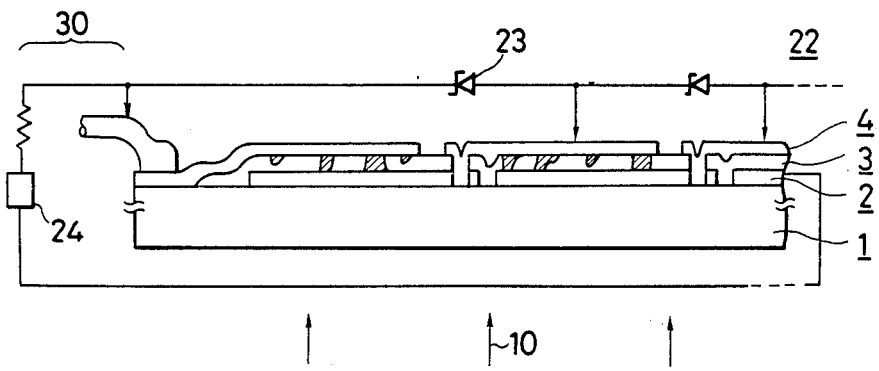
Figure 5:
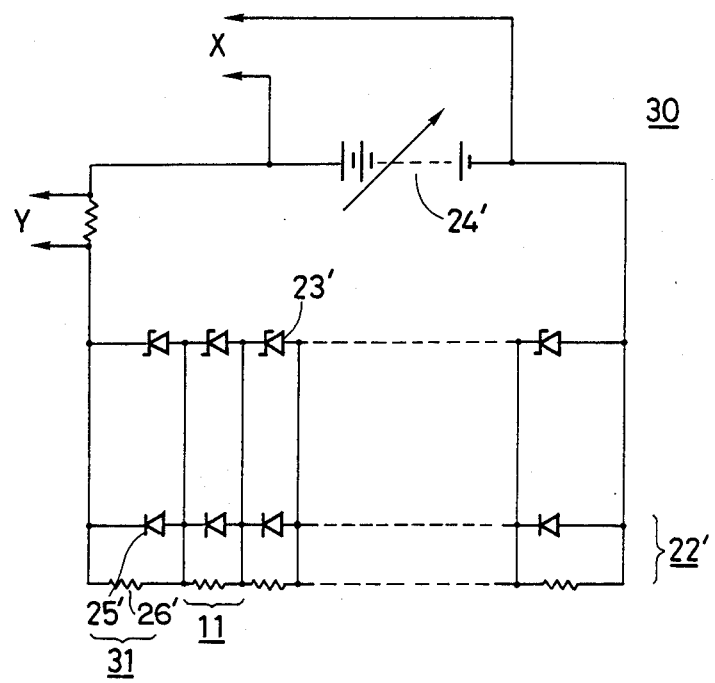
FIG. 5 is an equivalent circuit of another embodiment of the invention.

Referring to FIG. 4(D) and FIG. 5, a reverse bias applying circuit is illustrated. The circuit comprises a power supply 24' and a number of zener diodes 23'. Between each adjacent ones of the diodes 23' and between the power supply and the first or last diodes are made contact with the first and second electrodes respectively so that the output voltage is divided into the reverse bias voltage which is applied to each cells constituting the device. The reverse bias voltage must be less than the breakdown voltage of the p-i-n junction of the semiconductor layer 3. Because of this the reverse bias voltage does not cause current passing through flawless portion of the semiconductor layer 2. To preclude breakdown of the p-i-n junction further, the zener diodes are selected out of a variety of voltage deviding element candidates. The zener voltage is chosen slightly below the breakdown voltage of the p-i-n junction, In FIG. 5, the circuit diagram includes the number of the cells constituting the device each of which is represented by a diode corresponding to the semiconductor layer 2 and a resistance corresponding to the defects (holes) as leakage source. The zener diode 23' is connected in parallel to the diode and the resistance so that the voltage applied to the diode 25' is kept below the breakdown voltage thereof.

With the bias voltage less than the breakdown voltage, the holes or flaws in the semiconductor layer 3 filled with the organic resin become current passages which are heated as electric current flows therethrough. The electric power is sometimes short of burning out the holes or flaws completely. To make the burning out easy, the substrate 1 is heated in advance together with the semiconductor less than the temperature at which the semiconductor may be degraded, normally less than 150° C.

Figure 6:
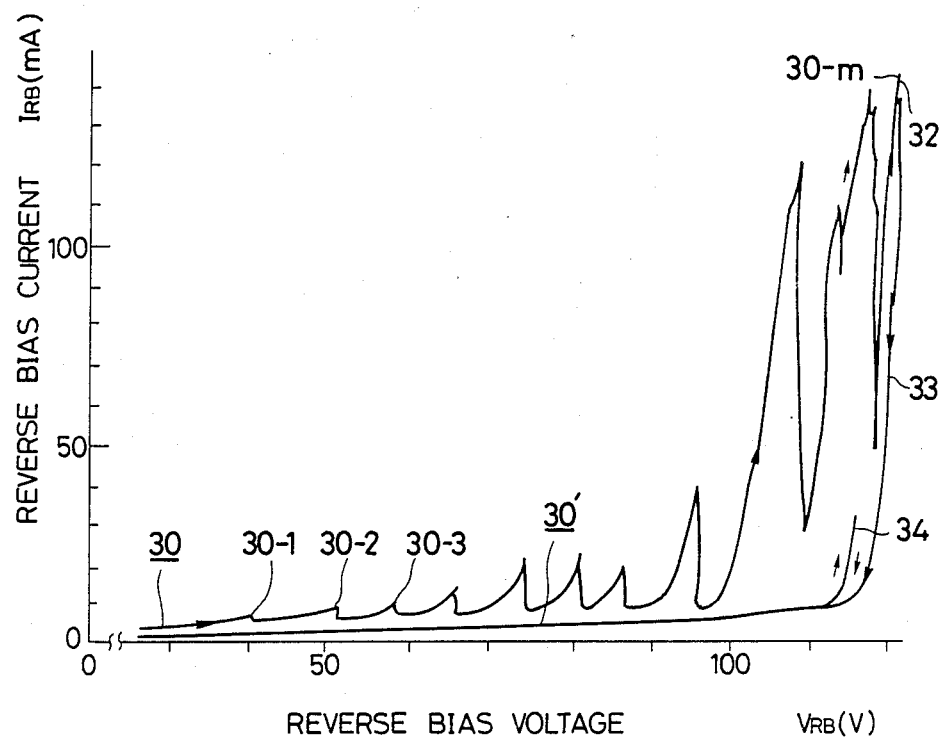
FIG. 6 is a graphical diagram showing the trend of reverse bias current in responce to increasing reverse bias voltage.
Figure 7A:
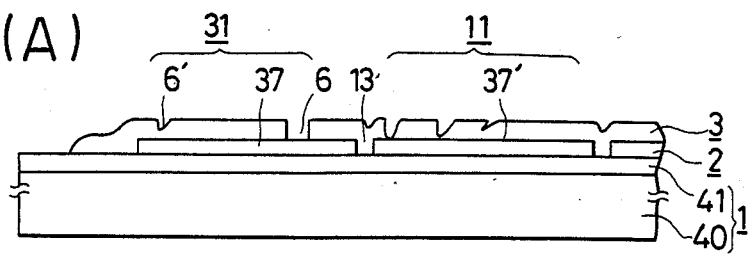
FIGS. 7(A) through 7(D) are fragmentary, cross sectional views showing further embodiment of the invention.
Figure 7B:
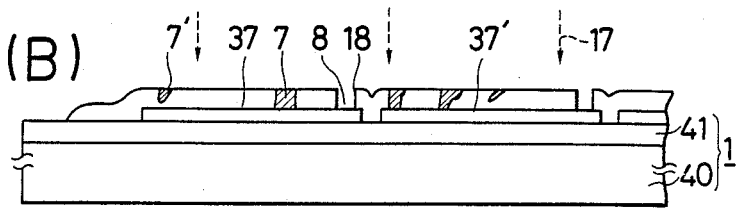
Figure 7C:
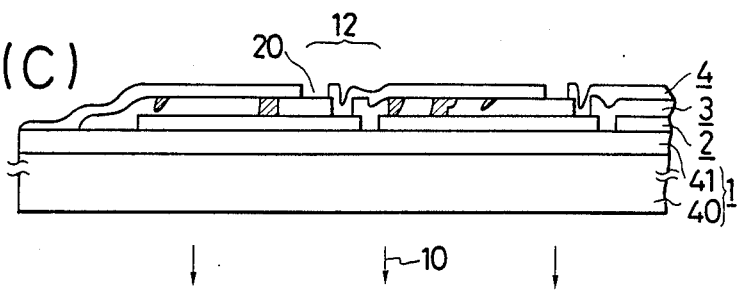
Figure 7D:
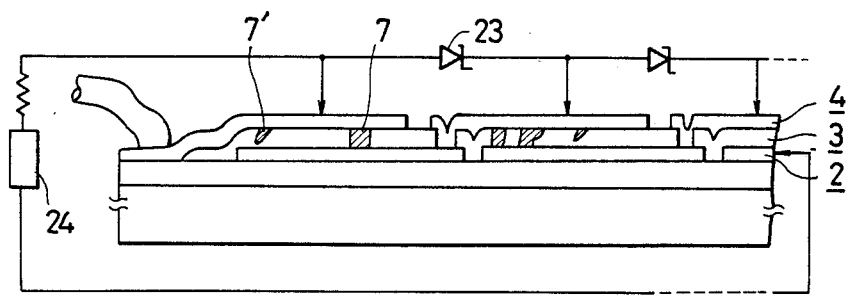

An experiment was made with a device having 15 cells connected with each other and the bias voltage is chosen at 120 V. As a result, the current trend in response to increasing reverse bias voltage was obtained as shown in FIG. 6.

In the experiment, the reverse bias voltage increased from 0 V to 120 V. A first leakage current was observed at 30-1. However the leakage current was cured because of burning out due to the concentrated current flow. As the reverse bias voltage increased, a number of current ripples were observed. The magnitude of the leakage current became larger at the higher reverse bias voltage. With the reverse bias voltage decreasing from a point 32, the reverse bias current smoothly dropped without leakage current.

For reference, the device thus treated was subjected to increasing reverse bias voltage. No leakage current, however, was observed until reverse current raised at the withstand voltage.

After removing the bias applying circuit, the device integrated on a 10 cm×10 cm panel was irradiated with light of 100 mW/cm² (AM1). The characteristics obtained are;
open-circuit voltage: 12.943 V
fill factor; 0.6641
short-circuit current; 79.34 mA
current density; 17.290 mA/cm² efficiency; 9.90%

With the device fabricated according to the process identical to that of the preceding in FIG. 4 but without reverse bias curing, the following experimental data 1 were obtained, and without stopping process and reverse bias curing, the following experimental data 2 were obtained:

|  | data 1 | data 2 |
|---|---|---|
| open-circuit voltage; | 12.315 V | 11.49 V |
| fill factor; | 0.597 | 0.471 |
| short-circuit current; | 79.34 mA | 53.7 mA |
| efficiency; | 8.33% | 4.43% |

Compared with the figures obtained with the initial embodiment, it is understood that the device having undergone the reverse bias voltage demonstrate further improved characteristics. The reason why the reverse bias curing is effective is considered in that a chemical reaction between the resin and the semiconductor may produce a stable insulator tightly joined to the pinholes.

Further embodiment of the invention is shown in FIG. 7. In this embodiment, the process is similar to that of the preceding embodiment. So only different configurations are described and redundant explanation does not repeated.

A substrate 1 is composed of a conductive stainless foil 40 of 10 to 100 micron meters thickness and a heatproof organic resin film or an inorganic insulator film such as made of enamel 41 on the stainless foil 40. On the substrate 1, a first electrode 2 is formed, for example, made of a 200 angstroms thick chromium layer, a 1500 angstroms thick aluminium layer plus a 500 angstroms thick $Sn_3N_4$ layer or a 1500 to 2000 angstroms thick transparent thick conductive layer mainly composed of tin oxide or tin nitride doped with halogen, Grooves 8 which provide accesses to the first electrode reach only to the surface of the first electrode 2 at which the second electrode can be in contact with the first electrode 2.

After removing the bias applying circuit, the device integrated on a 10cm×10 cm panel was irradiated with light of 100 mW/cm² (AM1). The characteristics obtained are;

open-circuit voltage: 12.618 V
fill factor; 0.678
short-circuit current; 79.710 mA
current density; 17.371 mA/cm²
efficiency; 9.82%

With the device fabricated according to the process identical to that of the preceding in FIG. 7 but without reverse bias curing, the following experimental data 1 were obtained, and without both stopping process and reverse bias curing, the following experimental data 2 were obtained:

|  | data 1 | data 2 |
|---|---|---|
| open-circuit voltage; | 11.30 V | 6.54 V |
| fill factor; | 0.626 | 0.368 |
| short-circuit current; | 79.4 mA | 75.69 mA |
| efficiency; | 8.16% | 3.48% |

The other important feature of the invention is, not illustrated in the figure, that high yield can be obtained since the fluctuation of the characteristics is small among products For instance, 0.195 ($\bar{X}$ 9.63%) was obtained as a variance of efficiency from ten samples of 10 cm long×10 cm wide prepared according to NEDO standard.

While the present invention has been described with reference to several preferred process and embodiments thereof, many variations and modifications will now occur to those skilled in the art. It is our intent, therefore, to be limited solely by the scope of the appending claims and not by the specific embodiment disclosed herein Examples of variation are as follow The semiconductor layer may be constituted with multijunction structure in place of single junction structure Namely, the layer can be a laminate composed of a p-type semiconductor ($Si_xC_{1-x}$), an intrinsic amorphous silicon semiconductor, an n-type silicon semiconductor, a p-type semiconductor ($Si_xC_{1-x}$), an intrinsic semiconductor ($Si_xGe_{1-x}$ and an n-type silicon semiconductor layer 300 to 1000 angstroms thick, wherein $0<X<1$, e.g., $X=0.5$.

To engrave the grooves, one line of the grooves can be formed at once by irradiating with laser beam extending in lateral direction which is produced from an eximer laser through a cylindrical lens, if necessary, after expansion of original beam.

The above technique according to the invention is applicable also to a light emitting semiconductor device with double heterojunctions and a super lattice structure. As such devices, the applicant has disclosed some semiconductor devices in U.S. Pat. Nos. 4,527,179 and 4,616,244.

The invention is advantageous also when applied to a diode array of an image sensor or a nonliner element of a thin film display. In some applications, the reverse bias voltage circuit can be dispensed with or very simplified. For example, an active device can be cured by applying a reverse voltage to source, drain and/or gate electrodes.

What is claimed is:

1. A semiconductor device comprising:
   a substrate;
   a first electrode formed on said substrate;
   a rectifying semiconductor layer formed on said first electrode, large defects of said semiconductor layer being filled with a resin and small defects, smaller than said large defects, having said resin therein and an insulator disposed between said last-mentioned resin and said rectifying semiconductor layer; and
   a second electrode formed on said semiconductor layer;
   whereby short circuiting between said first and second electrodes is minimized to (a) the resin which fills the large defects and (b) the insulator disposed in the small defects.

2. The device of claim 1 wherein said rectifying semiconductor layer is an amorphous semiconductor layer incorporating a pin junction.

3. A semiconductor device of claim 1 wherein said small defect is a pinhole.

4. A semiconductor device of claim 1 wherein said insulator is formed by a chemical reaction between the rectifying semiconductor layer and the resin disposed in the small defect, said chemical reaction being caused by a reverse bias local current which stops said small defect and is not conductive at least after the reaction.

5. A semiconductor device of claim 4 wherein said forming means is a heat source.

6. A semiconductor device of claim 1 wherein said resin is photocurable.

7. A semiconductor device of claim 1 wherein said device is a photovoltaic device.

8. A semiconductor device as in claim 1 including voltage regulation means for limiting the magnitude of the reverse voltage applied to the semiconductor layer to a value less than the breakdown voltage of the layer.

9. A semiconductor device as in claim 8 where said voltage regulation means includes at least one zener diode.

10. A semiconductor device as in claim 1 where said resin is primarily disposed between the first and second electrodes to thus substantially lessen short circuiting associated with the large defects.

11. A semiconductor as in claim 1 where the magnitude of said reverse voltage is such as to substantially lessen short circuiting associated with the small defects.

* * * * *